US006754094B2

(12) United States Patent
McClure (10) Patent No.: US 6,754,094 B2
(45) Date of Patent: Jun. 22, 2004

(54) CIRCUIT AND METHOD FOR TESTING A FERROELECTRIC MEMORY DEVICE (75) Inventor: David C. McClure, Carrollton, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/066,182

(22) Filed: Jan. 31, 2002

(65) Prior Publication Data

US 2003/0142565 A1 Jul. 31, 2003

(51) Int. Cl.[7] .......................... G11C 11/22; G11C 29/00
(52) U.S. Cl. ...................... 365/145; 365/149; 365/201
(58) Field of Search ............................. 365/145, 149, 365/201

(56) References Cited

U.S. PATENT DOCUMENTS

| 5,608,669 | A | | 3/1997 | Mi et al. ............... 365/185.19 |
| 5,652,725 | A | | 7/1997 | Suma et al. ................ 365/200 |
| 5,764,577 | A | * | 6/1998 | Johnston et al. ............ 365/201 |
| 5,991,189 | A | * | 11/1999 | Miwa .......................... 365/145 |
| 6,041,002 | A | | 3/2000 | Maejima ..................... 365/201 |
| 6,044,034 | A | * | 3/2000 | Katakura .................... 365/145 |
| 6,046,926 | A | * | 4/2000 | Tanaka et al. .............. 365/145 |
| 6,094,369 | A | * | 7/2000 | Ozawa et al. ............... 365/145 |
| 6,275,428 | B1 | * | 8/2001 | Fukuda et al. .............. 365/201 |
| 6,275,961 | B1 | * | 8/2001 | Roohparvar ................. 365/201 |
| 6,341,090 | B1 | | 1/2002 | Hiraki et al. ................ 365/200 |
| 6,359,819 | B1 | * | 3/2002 | McClure ...................... 365/201 |
| 6,452,845 | B1 | * | 9/2002 | Merritt ........................ 365/201 |
| 6,512,686 | B2 | * | 1/2003 | Miyamoto ................... 365/145 |
| 6,550,026 | B1 | * | 4/2003 | Wright et al. ............... 365/201 |
| 6,584,007 | B2 | * | 6/2003 | McClure ...................... 365/145 |
| 6,600,685 | B2 | * | 7/2003 | Iwase .......................... 365/201 |

FOREIGN PATENT DOCUMENTS

JP          61-22492 A       1/1986

OTHER PUBLICATIONS

Betty Prince; "Semiconductor Memories"; 1983, Wiley, 2nd Edition; pp. 719–721.

* cited by examiner

Primary Examiner—Trong Phan
(74) Attorney, Agent, or Firm—Lisa K. Jorgenson; Andre Szuwalski (57) ABSTRACT

A test circuit and method are disclosed for testing memory cells of a ferroelectric memory device having an array of ferroelectric memory cells. The test circuitry is coupled to the bit lines, for selectively determining the voltage levels appearing on the bit lines based on a measured current level and providing externally to the ferroelectric memory device an electrical signal representative of the sensed voltage levels. In this way, ferroelectric memory cells exhibiting degraded performance may be identified.

39 Claims, 4 Drawing Sheets

CIRCUIT AND METHOD FOR TESTING A FERROELECTRIC MEMORY DEVICE

BACKGROUND OF THE INVENTION

1. Technical Field of the Invention

The present invention relates to testing ferroelectric memory devices, and particularly to a test circuit and method for testing for effects of degradation of ferroelectric memory cells.

2. Description of the Related Art

Ferroelectricity is a phenomenon which can be observed in a relatively small class of dielectrics called ferroelectric materials. In a normal dielectric, upon the application of an electric field, positive and negative charges will be displaced from their original position—a concept which is characterized by the dipole moment or polarization. This polarization or displacement will vanish, however, when the electric field returns back to zero. In a ferroelectric material, on the other hand, there is a spontaneous polarization—a displacement which is inherent to the crystal structure of the material and does not disappear in the absence of the electric field. In addition, the direction of this polarization can be reversed or reoriented by applying an appropriate electric field.

These characteristics result in ferroelectric capacitors, formed from ferroelectric film or material disposed between parallel conduction plates, being capable of storing in a nonvolatile manner a first charge corresponding to a first polarization state in which the direction of polarization is in a first direction, and a second charge corresponding to a second polarization state in which the direction of polarization is in a second direction opposite the first direction. Ferroelectric capacitors are utilized in nonvolatile random access memory devices having a memory cell array architecture that is similar to the memory cell array architecture of dynamic random access memory (DRAM) devices.

Figure 1A:
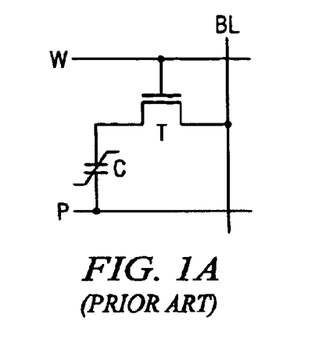
FIGS. 1A and 1B are circuit schematics of conventional 1T1C and 2T2C ferroelectric memory cells, respectively.

In general terms, there are two types of ferroelectric memory cells. Referring to FIG. 1A, a one transistor, one capacitor (1T1C) memory cell utilizes a pass gate transistor T connected between a bit/column line BL and a first plate of ferroelectric capacitor C. A second plate of ferroelectric capacitor C is connected to a plate line P. The gate terminal of pass gate transistor T is connected to a word/row line W. A memory device utilizing a 1T1C memory cell uses a reference memory cell that is accessed at the same time the 1T1C memory cell is accessed so as to provide a charge differential appearing across a pair of bit lines coupled to the 1T1C cell and the reference cell. The use of 1T1C ferroelectric memory cells is known in the art.

Figure 1B:
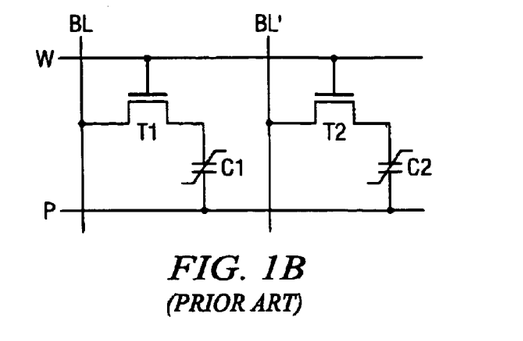

Referring to FIG. 1B, a two transistor, two capacitor (2T2C) memory cell includes two ferroelectric capacitors C1 and C2. A first pass gate transistor T1 may be connected between a first plate of ferroelectric capacitor C1 and a first bit line BL of a bit line pair. A second pass gate transistor T2 may be connected between a first plate of ferroelectric capacitor C2 and a second bit line BL' of the column line pair. A second plate of ferroelectric capacitors C1 and C2 may be connected to a plate line P. The gate terminal of pass gate transistors T1 and T2 may be connected to the word line W. Each capacitor C1 and C2 stores a charge representative of the polarization state thereof, the charge combining with the charge of the other capacitor to result in a charge differential appearing across bit lines BL and BL' when the 2T2C memory cell is accessed. The polarity of the charge differential denotes the binary value stored by the 2T2C memory cell. The use of 2T2C ferroelectric memory cells is known in the art.

Figure 2:
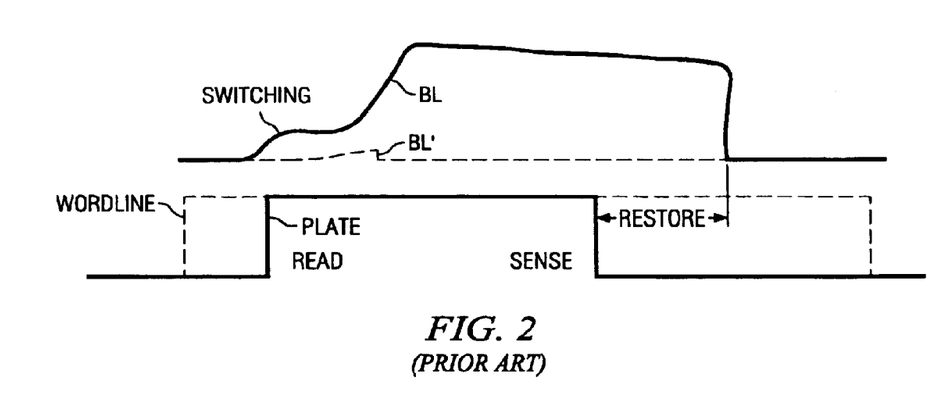
FIG. 2 illustrates a conventional timing diagram for the read and restore operation of a ferroelectric memory cell.

Referring now to FIG. 2, there is illustrated a timing diagram for the operation of a ferroelectric memory cell. As it should be understood that reading the value of a memory cell is destructive and the data value must be restored in the cell after the reading operation. When the plate is raised to a high logic value while the bit line is at a precharged low, the bit line gets charged by the switching charge of the cell while moving from a high logic value to a low logic value. The bit line charge differential may be used for the sensing operation as described herein above. The memory cell restoration takes place when the plate goes to a low logic value and the memory cell is driven to a high logic value and then finally back to its initial position when the bit line is driven to the low logic value.

A problem with ferroelectric memory devices is the existence of a phenomenon known as imprint. Imprint is a characteristic of ferroelectric films that refers to the tendency of a ferroelectric film/capacitor to prefer one polarization state over another polarization state. Imprint is known to occur when a ferroelectric capacitor is maintained in a single polarization state for a prolonged period of time. Imprint adversely effects the ability of a ferroelectric capacitor to switch between the polarization states. Consequently, the existence of imprint may directly impact the performance of a ferroelectric memory device.

Figure 3:
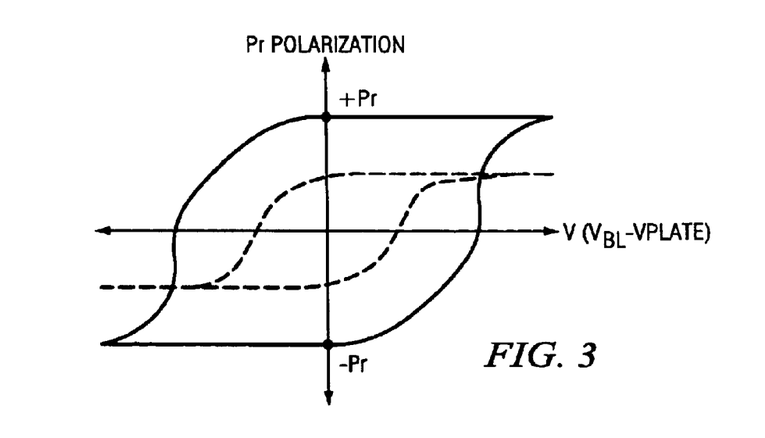
FIG. 3 illustrates the polarization characteristics of a ferroelectric memory cell operating under normal conditions and degraded conditions.

The performance of ferroelectric memory cells has been seen to degrade over time due to a number of other phenomena as well. For instance, ferroelectric memory cells may be effected by fatigue, endurance, retaining data over time, etc. When holding data over a prolonged period of time, such as under accelerated conditions during burn-in, a ferroelectric memory cell maybe seen to degrade over the course of several hours or days. FIG. 3 shows how a ferroelectric memory cell may be degraded, with the polarization characteristic being shown for a normal ferroelectric memory cell in a continuous set of lines and the polarization characteristic being shown for a degraded ferroelectric memory cell in dashed lines. At some point, a memory cell exhibiting degraded performance may store a charge in its ferroelectric capacitor that cannot be accurately sensed by a sense amplifier, thereby rendering the memory cell incapable of storing data values.

It is inconvenient to accurately test the capability of a ferroelectric memory cell to hold a voltage level using conventional memory read operations, to determine whether a long term reliability risk exists with the memory cell. This is in part due to the fact a conventional memory read operation may only test whether or not the memory cell is operational and does not provide an indication of an extent or amount of degradation of the memory cell. Based upon the foregoing, there is a need to be able to more easily test the soundness of a ferroelectric memory to determine the reliability risk of the ferroelectric memory device.

SUMMARY OF THE INVENTION

Embodiments of the present invention are directed to a method and apparatus for testing the soundness of and determining the reliability risk in using a random access memory device, such as a ferroelectric random access memory device. The random access memory device includes an array of memory cells arranged in rows and columns associated with word lines and bit lines, respectively, sense amplifier circuitry selectively disabled during the testing of the random access memory device, address decode circuitry for selecting rows of memory cells within the array, and test circuitry for providing a current level corresponding to a voltage level appearing across the ferroelectric capacitor(s) of a memory cell connected to a selected bit line. Each bit line may be connected to and control the operating characteristics of a distinct transistor of the test circuitry, wherein each transistor is externally accessible when selected.

The testing of the random access memory device may be performed by connecting memory cells in an addressed row to the bit lines of the array. The sense amplifiers are disabled when the random access memory device is under test. The bit lines are sequentially selected and a current is provided to a test pad having a level that is proportional to the voltage of the selected bit line. Because the voltage of the selected bit line is proportional to the voltage across the capacitor(s) of the memory cell connected thereto, the current level provided to the test pad is indicative of the voltage maintained by the memory cell.

In determining the voltage level maintained by a selected memory cell, a mapping between the current level measured at the test pad and the voltage level of the selected bit line may be performed by a calibration circuit. The operating characteristics of the calibration circuit are substantially the same as the operating characteristics of the test circuitry. The mapping provides a relationship between a measured current and voltage applied to the calibration circuit which is substantially the same as the relationship between the current measured at the test pad and the voltage appearing at the selected bit line. The voltage at the bit line may be more accurately determined from the measured current at the test pad and the operating characteristics of the calibration circuit.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 4:
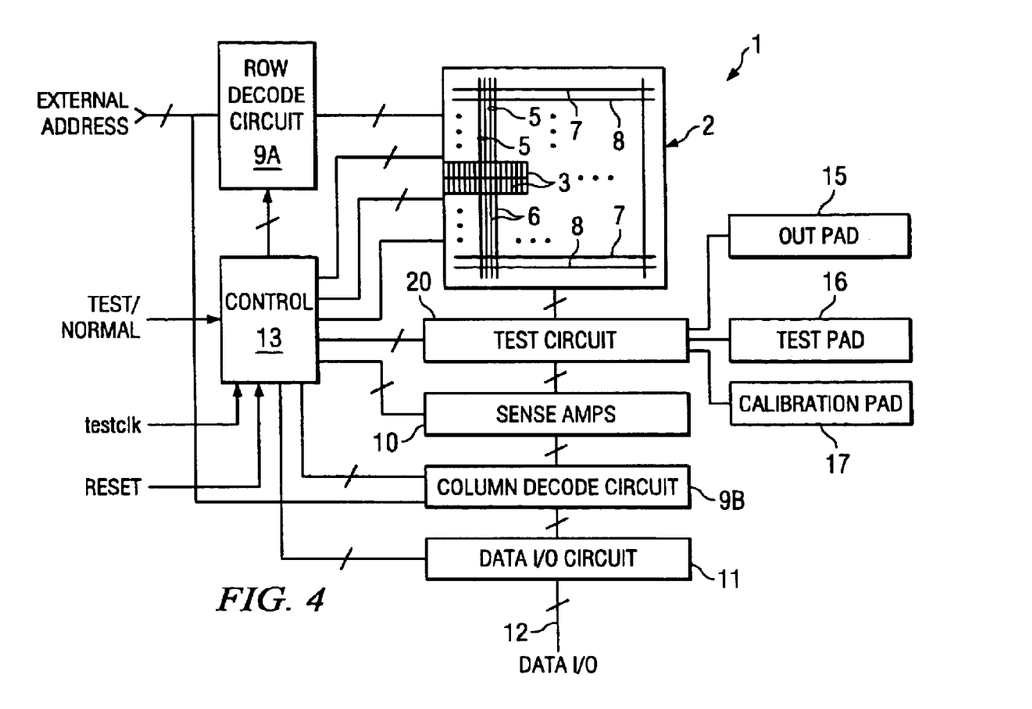
FIG. 4 is a block diagram of a memory device according to an embodiment of the present invention.

Referring to FIG. 4, there is shown a memory device 1 according to an exemplary embodiment of the present invention. Memory device 1 may be a nonvolatile memory device, such as a ferroelectric random access memory device. It is understood, however, that memory device 1 may be other memory devices as well. For instance, memory device 1 may include nonvolatile memory cells that may provide a degraded performance over time. The memory device 1 may be Dynamic Random Access Memory (DRAM), flash memory, Electrically Erasable Programable Read Only Memory (EEPROM), or Erasable Programable Read Only Memory (EPROM).

In addition, memory device 1 may itself form an integrated circuit chip or be a memory device that is embedded with other circuitry within an integrated circuit chip.

Memory device 1 includes a memory cell array 2 of memory cells 3. Memory cells 3 may be ferroelectric memory cells that include one or more ferroelectric capacitor elements. Memory cell 3 may be implemented as a one transistor, one capacitor (1T1C) memory cell (FIG. 1A). Alternatively, memory cell 3 may be implemented as a two transistor, two capacitor (2T2C) memory cell (FIG. 1B).

It is understood that each memory cell 3 may be implemented in other ways using one or more ferroelectric capacitive elements or similar elements. It should also be understood that memory cell 3 may be a DRAM memory cell, a flash memory cell, or any other type of memory cell that may exhibit degraded performance.

Memory cell array 2 may be arranged into rows and columns of memory cells 3. The memory cells 3 in a row of memory cells 3 may be connected to a distinct word line 7 and a distinct plate line 8. The memory cells 3 in a column of memory cells 3 may be connected to a distinct column/bit line 6 or a pair 5 of distinct column/bit lines.

FIG. 4 shows plate lines 8 being parallel to word lines 7. In this configuration, plate lines 8 can be coupled to more than one row of memory cells 3. Alternatively, it is understood that plate lines 8 may be perpendicular to word lines 7. In this configuration, the voltage appearing across the ferroelectric capacitors in the memory cells 3 in rows that are not being accessed will not vary when the plate line 8 connected to such memory cells 3 is asserted. This is due to the fact that the transistor(s) in the unaccessed memory cells 3 are turned off, so the plate line 8 connected to the transistor simply follows the voltage change appearing on the capacitor plate connected to the asserted plate line 8. In either the parallel or perpendicular configuration, it is understood that the plate lines 8 may be partitioned into smaller segments so that the plate lines 8 may be more easily driven.

Memory device 1 may further include address logic 9, such as a row decoder circuit 9A, which receives an external address value and asserts a word line 7 and plate line 8 pair corresponding to the address value; and column decoder circuit 9B, which receives the address value and connects one or more bit lines 6 to data input/output bus 12 via data input/output block 11. The row address decode circuit 9A drives the word line 7 to a voltage level so as to connect bit lines 6 to capacitive elements of memory cells 3 in the selected row. This causes the charge appearing in each memory cell 3 in the selected row to be shared with the charge (such as a zero charge) appearing on the corresponding bit line 6, thereby changing the voltage appearing on the corresponding bit line 6 accordingly.

Sense amplifiers 10 are coupled to bit lines 6 and each may be controlled to sense a charge differential appearing across a pair of bit lines 6 and drive the bit lines 6 to the high voltage reference Vdd and low voltage reference Vss based upon the polarity of the charge differential. Data input/output (I/O) block 11 serves as an interface between bit lines 6 and the external (I/O) data bus 12, wherein addressed bit lines 6 are coupled thereto. A control circuit 13 provides necessary timing and control signals to memory cell array 2, address logic 9, sense amplifiers 10 and data input/output block 11 to preform read and write memory access operations when memory device 1 is in a normal mode of operation, and to control the testing of memory cells 3 when memory device 1 is in a test mode of operation. Control circuit 13 will be described in greater detail below.

Memory device 1 is shown in FIG. 4 as having a bidirectional external data I/O bus 12. It is understood that memory device 1 may include separate unidirectional data input and data output buses instead.

As stated above, the performance of ferroelectric memory cells 3 have been found to degrade over time. In an effort to closely measure an extent of performance degradation of ferroelectric memory cells 3 for purposes of memory cell replacement or fabrication process analysis, memory device 1 includes test circuitry.

The test circuitry may include a test circuit 20 that is adapted to sense the voltage level appearing across the capacitor elements of the ferroelectric memory cells 3 and provide externally to memory device 1 electrical signals representative of the sensed voltage level. Test circuit 20 is capable of operating during the testing and/or characterizing of memory device 1, such as during wafer sort. It is understood, however, that test circuit 20 may be used to analyze memory device 1 at times other than at wafer sort.

During a memory access operation, such as a memory read operation, the charge stored across the capacitive element(s) in an addressed/selected ferroelectric memory cell 3 is shared with the charge initially appearing on the corresponding bit line 6. Test circuit 20 produces a current which is representative of a voltage appearing on the bit line 6 after a selected ferroelectric memory cell 3 is connected thereto. Because the voltage on the bit line 6 is representative of the charge on the ferroelectric capacitor and the voltage thereon, the current level provided by test circuit 20 is proportional to the charge/voltage maintained by the memory cell 3 under test.

The control circuit 13 may receive as an input a test/normal input signal which, based on its value, configures the memory device 1 in the test mode of operation. When in the test mode, sense amplifiers 10 are disabled by the control circuit 13 or otherwise disconnected from bit lines 6 so as to be incapable of sensing voltage levels appearing thereon. This results in memory device 1 being capable of performing memory read operations that are modified for testing memory cells 3. As stated above, the control circuit 13 provides control for the operations of the memory device 1. Precharge/equilibrate circuitry (not shown) may be controlled by the control circuit 13 so as to precharge the bit lines 6 to a predetermined voltage level, such as ground.

Figure 5:
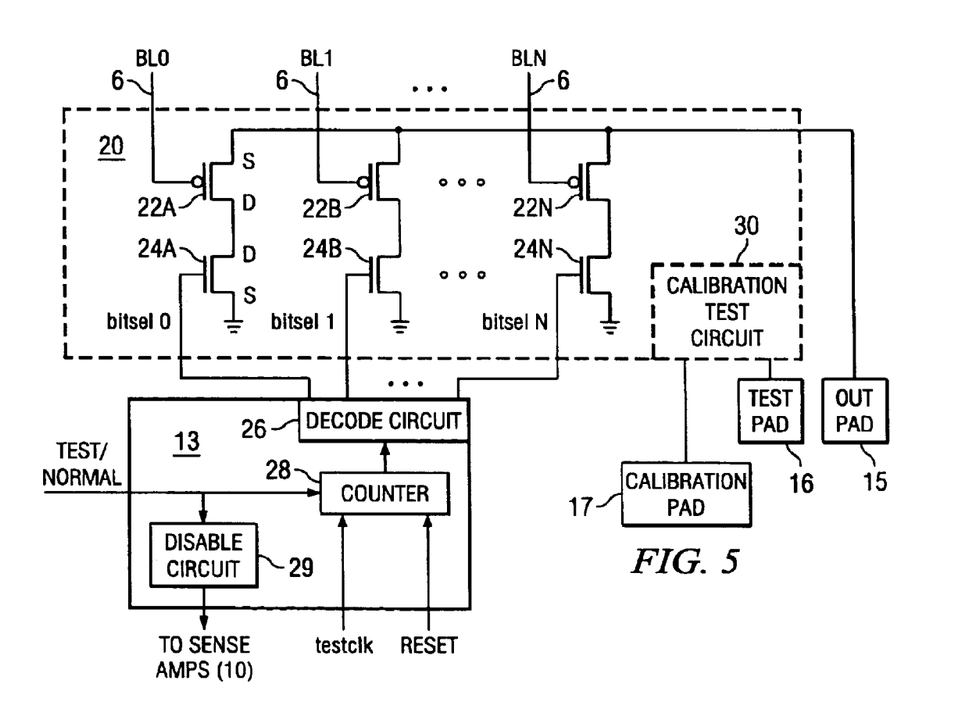
FIG. 5 is a test circuit for the memory device of FIG. 4.

FIG. 5 illustrates an exemplary embodiment of the test circuit 20 for the memory device 1 of FIG. 4. Each bit line 6 may be connected to a control terminal of one of a plurality of bit line (BL) connect transistors 22A–22N, with each BL connect transistor corresponding to a distinct bit line. A first terminal (source terminal) of each of the plurality of BL connect transistors 22A–22N may be connected to an external pad (Outpad) 15. The Outpad 15 is a pad capable of being connected to a tester probe (for wafer level testing) or a package pin (for post-packaging testing). The Outpad 15 is used to supply a voltage to the plurality of BL connect transistors 22A–22N and concurrently measure the level of current passing through a selected BL connect transistor 22A–22N, as will be explained in detail herein below. A second terminal (drain terminal) of each of the plurality of BL connect transistors 22A–22N may be connected to a first terminal (drain terminal) of one of a plurality of select transistors 24A–24N. The plurality of select transistors 24A–24N may be connected to ground through their second terminals (source terminals). The control terminals of the plurality of select transistors 24A–24N may be connected to control circuit 13 which in turn sequentially enables the plurality of select transistors 24A–24N.

The control circuit 13 may include a decode circuit 26 and a counter 28. The counter may 28 receive as input a reset signal used to reset the counter 28 to a known state and a test clock (testclk) signal used to increment/decrement the counter 28. In the exemplary embodiment of the present invention, the counter 28 automatically increments/decrements through a number of states equal to the number of bit lines 6 in memory device 1. The decode circuit 26 may decode the output of the counter 28 and send a signal to one of the select transistors 24A–24N to enable that select transistor while disabling the other select transistors. Once a select transistor 24A–24N is enabled, the voltage appearing on the bit line associated with the enabled select transistor may be measured, as will be described hereinafter. In an alternative embodiment, the decode circuit 26 and the counter 28 may be included in the test circuit 20.

Figure 6:
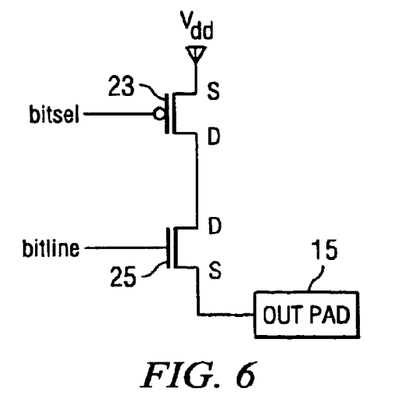
FIG. 6 is an alternative embodiment of a portion of the test circuit for the memory device of FIG. 4.

The BL connect transistors 22 and the select transistors 24 as shown in FIG. 5 are implemented by p-channel and n-channel MOS transistors, respectively. It should be understood that other types of field effect transistors, such as JFET and MESFET, maybe used as well. It should also be understood that the BL connect transistors 22 may be implemented as n-channel transistors and the select transistors as p-channel transistors. However, a different configuration may be used to achieve the same functionality described above. FIG. 6 illustrates an alternative implementation for the BL connect transistor 22 and the select transistor 24 of the test circuit 20 in FIG. 5. In this case, the bit line 6 may be connected to the control terminal of the BL connect transistor 25 and the output of decode circuit 26 may be connected to the control terminal of the select transistor 23. The source terminal of the select transistor 23 may be connected to Vdd while the drain terminal may be connected to the drain terminal of the BL connect transistor 25. The source of the BL connect transistor 25 maybe connected to the Outpad 15 where a voltage may be applied while a current is measured.

In order to accurately determine the voltage values maintained by memory cell 3 on the bit lines, a calibration may need to be performed. The calibration forms a matching/mapping relationship between the measured current levels at the Outpad 15 and the bit line voltage level appearing at the control terminal of the BL connect transistors 22A–22N. It should be understood that the calibration may be performed at any time relative to measuring current levels on Outpad 15.

Figure 7:
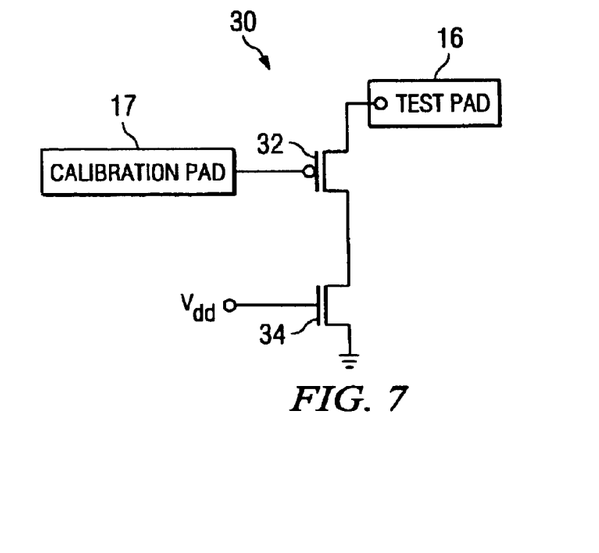
FIG. 7 is a calibration test circuit for the test circuit of FIG. 5.

Referring now to FIG. 7, there is illustrated calibration test circuit 30 for use in mapping the current values measured at the Outpad 15 with the voltage values appearing at the bit lines 6. A calibration connect transistor 32 and a select transistor 34 may be p-channel and n-channel MOSFET transistors, respectively. The control terminal of the select transistor 34 may be connected to Vdd to turn it on. The source terminal of the select transistor 34 may be connected to ground and the drain terminal of the select transistor 34 maybe connected to the drain terminal of the calibration connect transistor 32. The control terminal of the calibration connect transistor 32 may be connected to a calibration pad 17 and the source terminal may be connected to a test pad 16. Preferably, the calibration test circuit 30 may be fabricated on the same memory chip as the test circuit 20 and thus the transistors of the calibration test circuit 30 have the same processing-related characteristics as the transistors of the test circuit 20. In addition, transistors 32 and 34 may have substantially the same dimensions as transistors 22A–22N and 24A–24N, respectively. In this way, the operating characteristics of calibration test circuit 30 will substantially match the operating characteristics of each pair of BL connect transistors 22 and select transistors 24.

Figure 8:
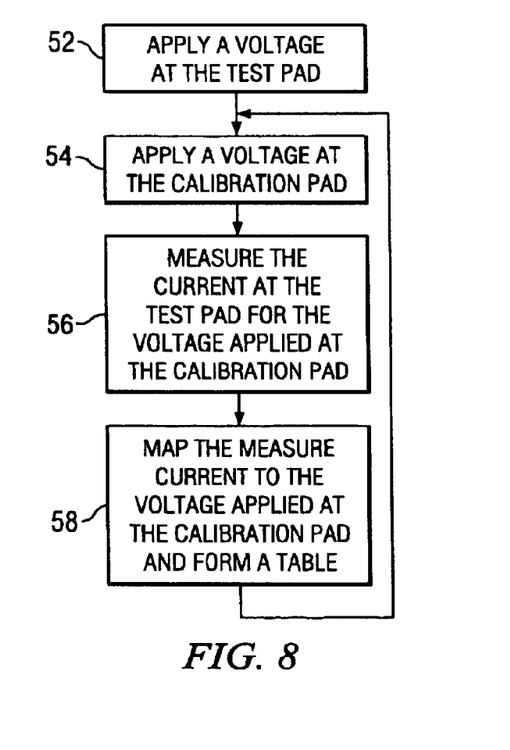
FIG. 8 is a flow chart illustrating an operation of the calibration test circuit of FIG. 7.

Referring now to FIG. 8, there is illustrated a flow diagram of the operation of the calibration test circuit 30. A voltage is applied at the test pad 16 (step 52) having a level such that a measurable amount of current can be measured at test pad 16. In the mean time, a voltage is applied at the calibration pad 17 (step 54) and the current is measured at the test pad 16 (step 56). The measured current at the test pad 16 corresponds to the applied voltage at the calibration pad 17. In an exemplary embodiment of the present invention, the voltage applied at the test pad 16 may be at a bias point such that the current can just be measured (i.e., transistor 32 is at the onset of conduction). The voltage applied to the calibration pad 17 is varied (i.e., decreased) and the current on the test pad 16 is measured for each of a plurality of voltage levels applied to calibration pad 17. As the calibration pad voltage is lowered, the current level measured at the test pad 16 increases. A direct relationship between the applied voltage at the calibration pad 17 and the current measured at the test pad 16 maybe recorded in a table (step 58). The relationship between the voltage level applied at the calibration pad 17 and the current measured at the test pad 16 is substantially the same as the relationship between the bit line voltage on the control terminal of the BL connect transistor 22 and the current measured at the Outpad 15. The table maybe used to determine the voltage level appearing on the selected bit line 6 which itself is proportional to the voltage maintained by the selected memory cell 3. The calibration testing may be performed before or after the testing of the memory cell array 2.

The operation of ferroelectric memory device 1 will be described with reference to FIG. 9. Initially, memory device 1 may be configured into a normal mode of operation (step 102) by setting one or more input test signals to a first value. Next, a plurality of write operations may be executed (step 104) so that each memory cell 3 stores a data value. Memory device 1 may be then configured in the test mode (step 106) by setting the one or more input test signals to a second value. The sense amplifiers 10 are disabled by the control circuit 13 when the memory device 1 is in the test mode. Next, the bit lines 6 are equilibrated and precharged (step 108) to a predetermined voltage level. In an exemplary embodiment, the bit lines 6 are precharged to ground. Precharge/equilibrate circuitry (not shown) may be controlled by control circuit 13 to perform the precharge/equilibration of the bit line 6.

A row of memory cells 3 is selected using the row decode circuit 9A by driving the selected word line to a Vdd voltage level (step 110) in response to application of an address input to the input of row decode circuit 9A. This results in each bit line 6 holding a charge corresponding to the charge maintained by the memory cell 3 connected to the bit line 6. The counter 28 within the control circuit 13 is reset using a RESET test signal to put the value of the counter in a known state. A bit line 6 is then selected by manipulating testclk so that counter 28 and decode circuit 26 activate one of the select transistors 24 (step 112). A voltage is applied at the Outpad 15 (step 114) and the current is measured concurrently at the Outpad 15 (step 116). The applied voltage at the Outpad 15 is at a bias level to just allow the flow of the current (i.e., so that the selected BL connect transistor 22 is at the onset of conduction). This applied voltage is substantially the same as the voltage applied at the test pad 16 during the operation of calibration test circuit 30, as explained above with reference to FIGS. 7 and 8. The measured current at the Outpad 15 is proportional to the voltage appearing on the selected bit line 6, which is itself proportional to the voltage/charge maintained by the memory cell 3 connected to the selected bit line 6. Because the current-voltage relationship of calibration test circuit 30 is substantially the same as the current-voltage relationship of test circuit 20, the voltage level maintained by the memory cell 3 may be determined (step 124) using the table recorded in step 58 of FIG. 8.

Next, the voltage level maintained by the memory cell 3 connected to the selected bit line 6 may be compared to a predetermined threshold voltage level (step 126) to determine if the memory cell 3 will be sufficiently usable over a prolonged period of time. In the case of the selected memory cell 3 storing a logic one data value and the voltage level being greater than the threshold voltage level, the tested memory cell 3 may be deemed to be operating at an acceptable level (marked at step 128). In the case of the selected memory cell 3 storing a logic zero data value and the voltage level being less than the threshold voltage level, the tested memory cell 3 may be deemed to be operating at an acceptable level. However, if the voltage level is below the predetermined threshold voltage level for logic one data values or above the predetermined threshold voltage level for logic zero data values, then the memory cell 3 may be marked as defective (step 130).

It should be understood that the above mentioned steps may be performed in a different order. For instance, the step of applying voltage at the Outpad 15 (step 114) may be performed at anytime during the step of measuring the current (step 116). For example, step 114 may be performed before the equilibration of the bit lines (step 108) and maintained throughout the time the current is measured.

After a memory cell 3 has been tested, another bit line 6 may be selected (step 120) on the same row of memory cells by incrementing/decrementing the counter 28 by toggling test signal testclk. The output of counter 28 may be passed through the decode circuit 26 which in turn only activates another select transistor 24. Steps 114–118 are then repeated to test the memory cell 3 corresponding to the newly selected bit line 6. Once all the memory cells 3 in the selected row have been tested (step 118), another row of memory cells 3 is selected to test the memory cells 3 therein (step 122). This process is repeated until all the memory cells 3 in the array 2 have been tested. Upon the completion of the testing operation, the memory cells 3 marked as unacceptable may be replaced by redundancy circuitry (not shown). Alternatively, the memory device 1 may be scrapped.

Figures 9, 10:
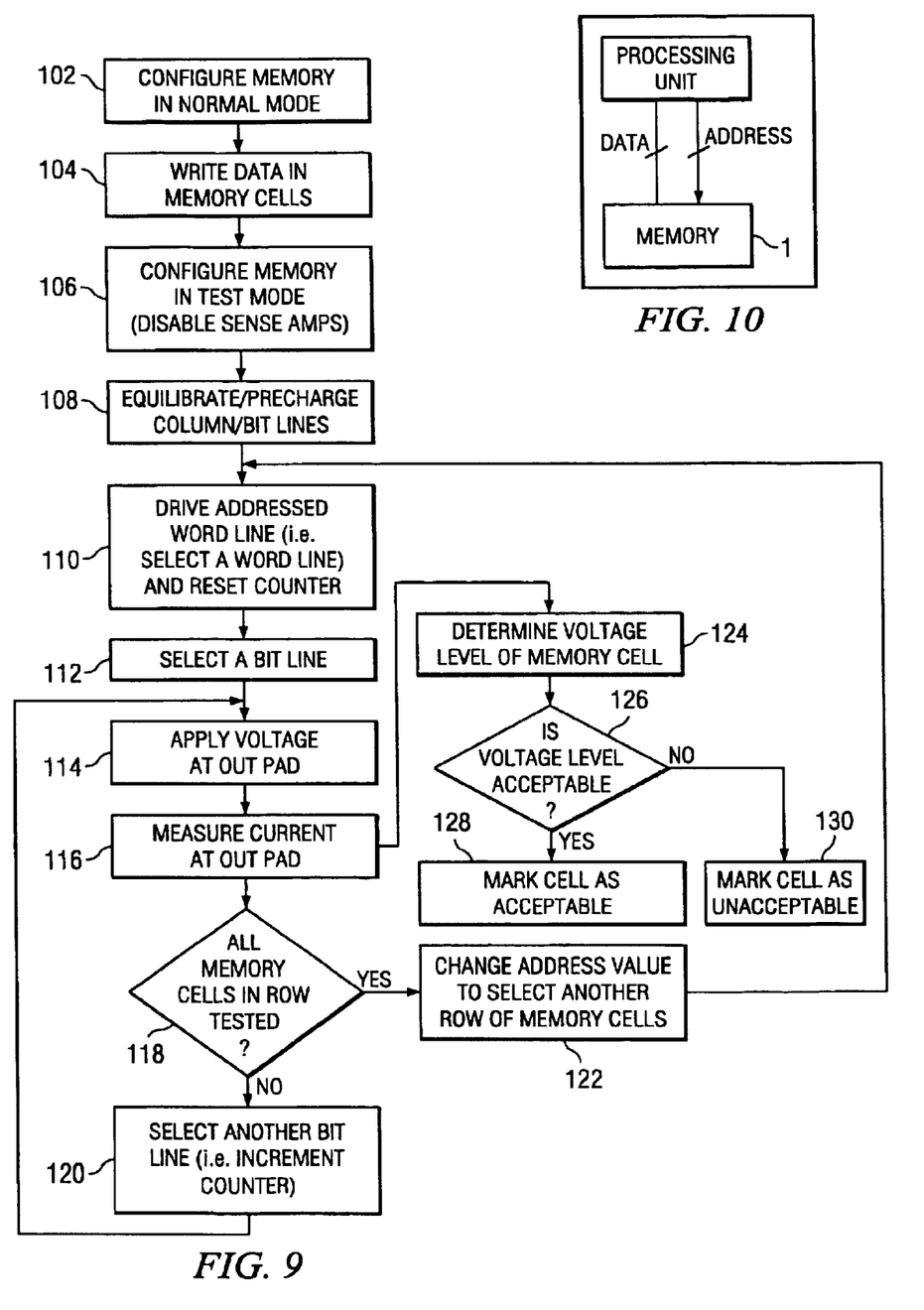
FIG. 9 is a flow chart illustrating a test operation of the memory device of FIG. 4.
FIG. 10 is a block diagram of an apparatus incorporating the memory device of FIG. 4.

Referring to FIG. 10, memory device 1 may form part of an apparatus including a processing unit having an address port connected to an address input port of memory device 1 and a data port connected to a data port of memory device 1.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A random access memory device, comprising:
    a memory array of memory cells organized into rows and columns, including a plurality of word lines and bit lines, each row of memory cells being coupled to a word line and each column of memory cells being coupled to a bit line;
    sense amplifier circuitry coupled to the bit lines and being selectively disabled;
    address decode circuitry for receiving an address value and asserting a row line associated therewith; and
    test circuitry, coupled to at least one bit line, for placing on an external pad of the integrated circuit chip a current level corresponding to a voltage level appearing on the at least one bit line, the test circuitry comprising:
        a plurality of pairs of series-connected transistors coupled between the external pad and a reference voltage level, each pair of series-connected transistors including a first transistor having a control terminal coupled to a distinct one of the plurality of bit lines.

2. The random access memory device of claim 1, wherein the random access memory device comprises a ferroelectric memory device.

3. The random access memory device of claim 1, wherein the random access memory device comprises a nonvolatile memory device.

4. The random access memory device of claim 1, wherein the sense amplifier selectively drives the bit lines towards high and low reference voltage levels during normal memory access operations, the random access memory device is selectively configured in a test mode of operation by the test circuitry, and the sense amplifier circuitry is disabled from driving the bit lines by the test circuitry when the random access memory device is in the test mode of operation.

5. The random access memory device of claim 4, wherein the random access memory device includes a test input signal and is selectively configured in the test mode of operation based upon a value of the test input signal.

6. The random access memory device of claim 1, wherein the external pad is sized for external test connection.

7. The random access memory device of claim 1, wherein each pair of series-connected transistors comprises a second transistor having a control terminal connected to a control signal that selectively activates the second transistor.

8. The random access memory device of claim 7, further comprising a selection circuit that selectively activates the second transistors of the plurality of pairs of series-connected transistors in a sequential manner.

9. The random access memory device of claim 8, wherein the selection circuit comprises counter circuitry and decode circuitry having a plurality of output signals such that each output signal is connected to the control terminal of a distinct one of the second transistors in each of the plurality of pairs of series connected transistors.

10. The random access memory device of claim 1, wherein the current level placed on the external pad by the test circuitry is proportional to the voltage level appearing on the at least one bit line.

11. The method of claim 1, wherein the current level provided to the pad is proportional to the voltage level appearing on the selected bit line.

12. A random access memory device, comprising:
    a memory array of memory cells organized into rows and columns, including a plurality of word lines and bit lines, each row of memory cells being coupled to a word line and each column of memory cells being coupled to a bit line;
    sense amplifier circuitry coupled to the bit lines and being selectively disabled;
    address decode circuitry for receiving an address value and asserting a row line associated therewith; and
    test circuitry, coupled to at least one bit line, for placing on an external pad of the integrated circuit chip a current level corresponding to a voltage level appearing on the at least one bit line, wherein the test circuitry comprises:
        a first pair of series-connected transistors connected between the external pad of the integrated circuit chip and a reference voltage level, a first transistor of the first pair of series-connected transistors having a control terminal connected to the at least one bit line; and
        a second pair of series-connected transistors connected between a test pad of the integrated circuit chip and the reference voltage level, a first transistor of the second pair of series-connected transistors having a control terminal connected to a calibration third pad of the integrated circuit chip and a second transistor of the second pair of series-connected transistors being activated.

13. A random access memory device, comprising:
    a memory array of memory cells organized into rows and columns, including a plurality of word lines and bit lines, each row of memory cells being coupled to a word line and each column of memory cells being coupled to a bit line;
    sense amplifier circuitry coupled to the bit lines and being selectively disabled;
    address decode circuitry for receiving an address value and asserting a row line associated therewith;
    test circuitry, coupled to at least one bit line, for placing on an external pad of the integrated circuit chin a current level corresponding to a voltage level appearing on the at least one bit line; and
    calibration test circuitry for providing a matching relationship between the current level placed on the external pad and the voltage level appearing at the at least one bit line.

14. The random access memory device of claim 13, wherein the test circuitry has a portion for placing having an electrical structure and the calibration test circuitry has substantially the same electrical structure as the portion for placing of the test circuitry.

15. The random access memory device of claim 13, wherein the calibration test circuitry comprises:
    an input connected to a calibration external pad for externally controlling the operating characteristics of the calibration circuit; and
    an output connected to a third test external pad for externally measuring a current flowing through the calibration test circuitry.

16. An apparatus, comprising:
    a random access memory device, comprising:
        a memory array of memory cells organized into rows and columns, including a plurality of word lines and bit lines, each row of memory cells being coupled to a word line and each column of memory cells being coupled to a bit line;

sense amplifier circuitry coupled to the bit lines;

address decode circuitry for receiving an address value and asserting a row line associated therewith; and test circuitry, coupled to at least one bit line for placing on an external pad during a test mode of operation a current level corresponding to a voltage level appearing on the at least one bit line, the test circuitry comprising:

a pair of series-connected transistors coupled between the external pad and a reference voltage level, the pair of series-connected transistors including a first transistor having a control terminal coupled to the at least one bit line.

17. The apparatus of claim 16, wherein the random access memory device comprises a ferroelectric memory device.

18. The apparatus of claim 16, wherein the random access memory device comprises a nonvolatile memory device.

19. The apparatus of claim 16, wherein the random access memory device comprises sense amplifier circuitry that selectively drives the bit lines towards high and low reference voltage levels during normal memory access operations, the random access memory device is selectively configured in a test mode of operation by the test circuitry and the sense amplifier circuitry is disabled from driving the bit lines by the test circuitry when the random access memory device is in the test mode of operation.

20. The apparatus of claim 16, wherein the apparatus further comprises:

a processing unit having an address port connected to an address input port of the random access memory device and a data port connected to a data port of the random access memory device.

21. The apparatus of claim 16, wherein the external pad is sized for external test connection.

22. The apparatus of claim 16, wherein the pair of series-connected transistors further comprises a second transistor having a control terminal connected to a control signal that selectively activates the second transistor.

23. The apparatus of claim 16, wherein the test circuitry comprises a plurality of pairs of series-connected transistors coupled between the external pad and a reference voltage level, each pair of series-connected transistors including a first transistor having a control terminal coupled to a distinct one of the plurality of bit lines.

24. The apparatus of claim 23, wherein each pair of series-connected transistors comprises a second transistor having a control terminal connected to a control signal that selectively activates the second transistor.

25. The apparatus of claim 24, wherein the test circuitry comprises a selection circuit that selectively activates the second transistors of the plurality of pairs of series-connected transistors in a sequential manner.

26. The apparatus of claim 25, wherein the selection circuit comprises counter circuitry and decode circuitry having a distinct output signal connected to the control terminal of each of the second transistors.

27. The apparatus of claim 16, wherein the test circuitry further comprises:

a second pair of series-connected transistors connected between a test pad of the apparatus and the reference voltage level, a first transistor of the second pair of series-connected transistors having a control terminal connected to a calibration pad of the apparatus and a second transistor of the second pair of series-connected transistors being activated.

28. The apparatus of claim 16, wherein the random access memory device further comprises:

calibration test circuitry for providing a matching relationship between the current level and the voltage level appearing at the at least one bit line.

29. The apparatus of claim 28, wherein the test circuitry has a portion for placing having an electrical structure and the calibration test circuitry has substantially the same electrical structure as the portion for placing of the test circuitry.

30. The apparatus of claim 28, wherein the calibration test circuitry comprises:

an input connected to a calibration external pad for externally controlling the operating characteristics of the calibration circuit; and an output connected to a test external pad for externally measuring a current flowing through the calibration test circuitry.

31. The apparatus of claim 16, wherein the current level placed on the external pad is proportional to the voltage level appearing on the at least one bit line.

32. An apparatus, comprising:

a ferroelectric capacitor; and means for placing on an external pad of the apparatus dining a test mode of operation a current level corresponding to a voltage level appearing across the ferroelectric capacitor, said means comprising a first transistor having a control terminal coupled to a plate of the ferroelectric capacitor, a first conduction terminal coupled to the external pad and a second conduction terminal, and a second transistor having a first conduction terminal connected to a voltage reference and a second conduction terminal connected to the second conduction terminal of the first transistor, and a means for selectively activating the second transistor during the test mode of operation.

33. The apparatus of claim 32, wherein the current level placed on the external pad by the means for placing is proportional to the voltage level appearing across the ferroelectric capacitor.

34. The apparatus of claim 32, wherein the plate of the ferroelectric capacitor is coupled to a column line, and the control terminal of the first transistor is connected to the column line.

35. A The apparatus of claim 32, further comprising a control counting circuit having an output coupled to a control terminal of the second transistor.

36. The apparatus of claim 32, further comprising a sense amplifier coupled to the plate of the ferroelectric capacitor, and wherein the means for placing further comprises a disable circuit for disabling the sense amplifier when the current level is placed on the external pad during the test mode of operation.

37. The apparatus of claim 32, further comprising calibration circuitry comprising a third transistor having a first conduction terminal coupled to a test external pad, a second conduction terminal and a control terminal coupled to a calibration external pad, and a fourth transistor having a first conduction terminal connected to the second conduction terminal of the third transistor, a second conduction terminal connected to the voltage reference and a control terminal coupled to a voltage level to activate the fourth transistor.

38. The apparatus of claim 37, wherein the third and fourth transistors substantially match the first and second transistors, respectively.

39. The apparatus of claim 37, wherein the third and fourth transistors have substantially the same operating characteristics as the first and second transistors, respectively.

* * * * *

UNITED STATES PATENT AND TRADEMARK OFFICE
CERTIFICATE OF CORRECTION

PATENT NO. : 6,754,094 B2
DATED : June 22, 2004
INVENTOR(S) : David C. McClure

It is certified that error appears in the above-identified patent and that said Letters Patent is hereby corrected as shown below:

Column 2,
Line 32, replace "maybe" with -- may be --.

Column 6,
Lines 39 and 52, replace "maybe" with -- may be --.

Column 7,
Lines 7, 39 and 45, replace "maybe" with -- may be --.

Column 8,
Line 45, replace "anytime" with -- any time --.

Column 10,
Line 28, replace "calibration third pad" with -- calibration pad --.
Line 43, replace "chin" with -- chip --.
Line 60, replace "to a third test" with -- to a test --.

Column 12,
Line 22, replace "dining".

Signed and Sealed this

Thirtieth Day of August, 2005

JON W. DUDAS
*Director of the United States Patent and Trademark Office*